United States Patent

Hahn et al.

[11] Patent Number: 5,840,373
[45] Date of Patent: Nov. 24, 1998

[54] METHOD OF GROWING FILMS BY FLAME SYNTHESIS USING A STAGNATION-FLOW REACTOR

[75] Inventors: David W. Hahn, Dublin; Christopher F. Edwards, Sunnyvale, both of Calif.

[73] Assignee: Sandia Corporation, Livermore, Calif.

[21] Appl. No.: 699,817

[22] Filed: Aug. 19, 1996

[51] Int. Cl.[6] ................................................ B05D 1/08
[52] U.S. Cl. .......................... 427/446; 427/450; 427/249
[58] Field of Search ............................... 427/249, 248.1, 427/446, 450

[56] References Cited

PUBLICATIONS

Hahn et al, Appl. Phys. lett. 68(15), Apr. 1996, pp. 2158–2160.

McCarty et al, Appl. Phys. lett. 63(1), Sep. 1993, pp. 1498–1500.

*Primary Examiner*—Roy V. King
*Attorney, Agent, or Firm*—Timothy P. Evans; Kurt C. Olsen

[57] ABSTRACT

A method of stabilizing a strained flame in a stagnation flow reactor. By causing a highly strained flame to be divided into a large number of equal size segments it is possible to stablize a highly strained flame that is on the verge of extinction, thereby providing for higher film growth rates. The flame stabilizer is an annular ring mounted coaxially and coplanar with the substrate upon which the film is growing and having a number of vertical pillars mounted on the top surface, thereby increasing the number of azimuthal nodes into which the flame is divided and preserving an axisymmetric structure necessary for stability.

8 Claims, 3 Drawing Sheets

METHOD OF GROWING FILMS BY FLAME SYNTHESIS USING A STAGNATION-FLOW REACTOR

STATEMENT OF GOVERNMENT INTEREST

This invention was made with Government support under contract no. DE-AC04-94AL85000 awarded by the U. S. Department of Energy to Sandia Corporation. The Government has certain rights in the invention.

BACKGROUND OF THE INVENTION

This invention relates generally to the deposition of heat or materials onto a substrate and, more particularly, to spatial stabilization of flames for combustion synthesis.

It is well known to those skilled in the art that certain flow configurations have important similarity properties that render their analysis one-dimensional. Included in this set is stagnation flow. Given that a uniform velocity, uniform temperature and uniform composition inlet flow issues from a manifold or nozzle a fixed distance above a parallel fixed solid surface which is at uniform temperature, it can be shown that the heat and mass flux to the solid surface will be everywhere uniform regardless of the radial extent of the system. In addition, the gas phase species and temperature profiles are independent of radius. A more complete discussion of stagnation flow is contained in co-pending application Ser. No. 08/302,155, incorporated herein by reference. The inherent radial uniformity of a stagnation flow geometry provides an important means for achieving uniform species and heat fluxes to large surface areas. This technology has application to materials synthesis processes, such as chemical vapor deposition for the fabrication of semiconductors and flame synthesis of diamond films all of which require very highly uniform film growth over relatively large areas so that many identical devices can be cut from a single large wafer.

A stagnation flow reactor useful for the flame synthesis of a diamond film is shown in FIG. 1. A reactive gas mixture 105 is caused to flow through nozzle 110 and the gas mixture is ignited subsequent to its passage through nozzle 110 to form a flame 140 which impinges onto substrate 120. This reactor is designed to yield a flat flame reaction zone such that uniform fluxes of reactive species and heat necessary for the growth of the diamond film are supplied to substrate surface 120. In order to obtain the desired diamond film growth rates it is necessary to strain or press the leading edge or front of flame 140 as close as possible to the surface of substrate 120. This can be accomplished by decreasing the separation distance d between nozzle surface 110 and substrate surface 120. In order for the film grown on substrate 120 to be of uniform thickness across the surface of substrate 120 it is necessary that nozzle 110 be parallel to substrate 120. It will be appreciated that as the distance d is decreased to values desirable for an acceptable growth rate for the flame synthesis of diamond, the rate of strain, defined as the gradient of the velocity profile at the flame front, is near the extinction limit where the flame cannot be sustained. In this regime the flame displays certain angular assymmetries that are manifest in a series of azimuthal structures 210, as depicted in FIG. 2. Here the n=3 mode number azimuthal structure is shown for a highly strained flame. The flame is very unstable during these low mode number instabilities and flame extinction typically occurs within a time-scale of seconds. What is needed is a method for eliminating or reliably controlling the low mode number instabilities that appear under conditions of highly strained flame synthesis and for providing long term stability (on the order of hours) for the flame front for use in combustion or flame synthesis applications, particularly synthesis of diamond.

SUMMARY OF THE INVENTION

The present invention provides for eliminating spatial instabilities in highly strained flame reactors, thereby providing for long term flame stability useful for combustion synthesis applications and particularly for the flame synthesis of diamond.

In flame synthesis, a material is grown as a film on a substrate as a consequence of reactive species formed in or near a flame and the elevated temperature of the substrate resulting from the flame impinging upon the substrate. It is desirable to have as high a growth rate of the resultant film as possible. In order to accomplish high growth rates during flame synthesis it is necessary that the flame be strained, i.e., the distance between the flame front and the substrate upon which a film is being grown be as small as possible. In this way large concentrations of reactive species are proximate the substrate and, because of the high flow speeds, there is rapid renewal of the reactive species. However, highly strained flames are very unstable, operating near the flame extinction limit where combustion cannot be sustained.

It has been observed that the outer diffusion flame of highly strained flames breaks down into an asymmetric nodal structure. It has been further observed that when the mode number (i.e., the number of nodal structures) is low, for example, n=3, flame extinction typically occurs in a manner of seconds.

The inventors have discovered that it is possible to provide long term stability to highly strained flame reactors by forcing a highly strained flame into a selected mode such that the flame is constrained into a more axisymmetric configuration. Rather than trying to eliminate entirely the azimuthal instabilities that lead to flame extinction it has been found that by increasing the number of azimuthal nodes (i.e., higher mode number) flame stability is likewise increased from a period of time measured in seconds to hours.

BRIEF DESCRIPTION OF THE DRAWINGS

The accompanying drawings, which are incorporated in and form part of the specification, illustrate the present invention and, together with the description, explain the invention. In the drawings like elements are referred to by like numbers.

DETAILED DESCRIPTION OF THE INVENTION

The present invention discloses a device useful for providing spatial stabilization of flames for combustion synthesis applications.

Figure 1:
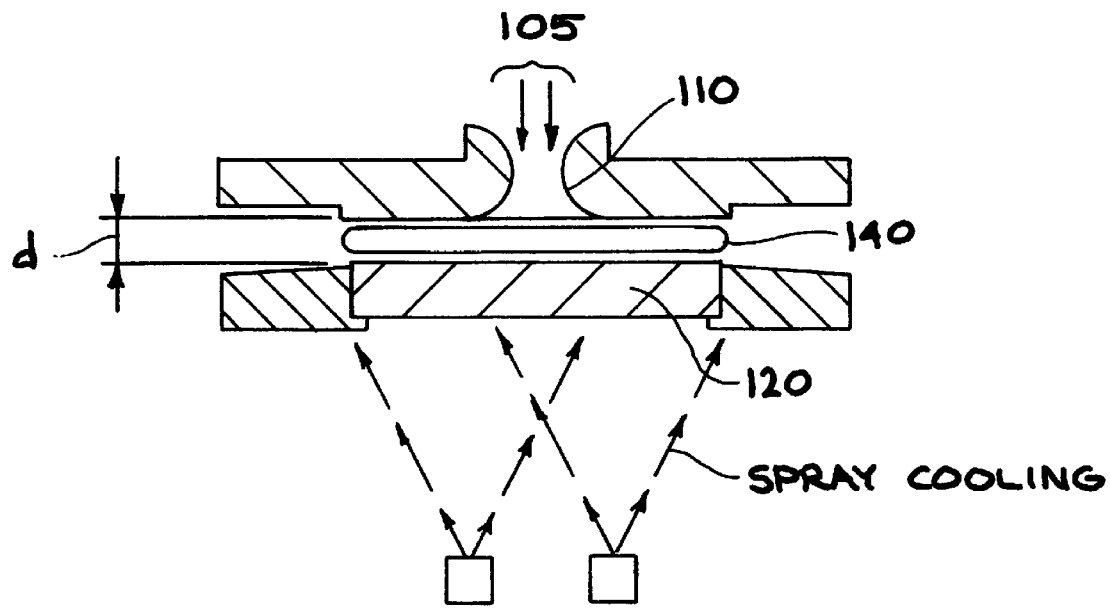
FIG. 1 shows a prior art stagnation flow reactor having a strained flame configuration.

FIG. 1 illustrates a typical stagnation flow reactor useful for flame synthesis of materials. Here, a reactive gas 105 flows thorough nozzle 110. Spaced opposite and oriented parallel to nozzle 110 is substrate 120 upon which the flame-synthesized material is grown as a film. The reactive gas flowing through nozzle 110 is ignited to form a flame 140 in the space between nozzle 110 and substrate 120.

In stagnation flow reactors adapted for flame synthesis of materials such as diamond, diamond-like carbon or high temperature ceramics such as silicon nitride, it is highly desirable to achieve as high a growth rate of the material being synthesized as possible. This desire for high growth rates necessarily requires that the flame front be strained or pressed as closely as possible to the substrate surface whereupon the film is grown. Referring now to FIG. 1, a highly strained flame can be formed by decreasing the separation distance d between nozzle surface 110 and substrate surface 120. However, as this distance d is decreased to values which can yield an acceptable growth rate for flame synthesis of diamond (typically growth rates greater than 25 μm/hr), the rate of strain, defined as the gradient of the velocity profile at the flame front, is near the extinction limit where the flame cannot be sustained. By way of example, for a separation distance d between substrate 120 and nozzle surface 110 of 2.5 mm and an inlet gas velocity of 72 m/s for a mixture of oxygen/acetylene/hydrogen, the calculated strain rate is on the order of 35,000/s. Thus, this flame is highly strained and operating near the flame extinction limit where combustion cannot be sustained. However, this mode of operation offers the advantage, in the case of flame synthesis of diamond with a oxygen/acetylene/hydrogen flame, that the formation of large concentrations of atomic hydrogen and methyl radicals in the vicinity of the oxygen/acetylene/hydrogen flame and their subsequent rapid transport to the substrate provides for high growth rates.

Figure 2:
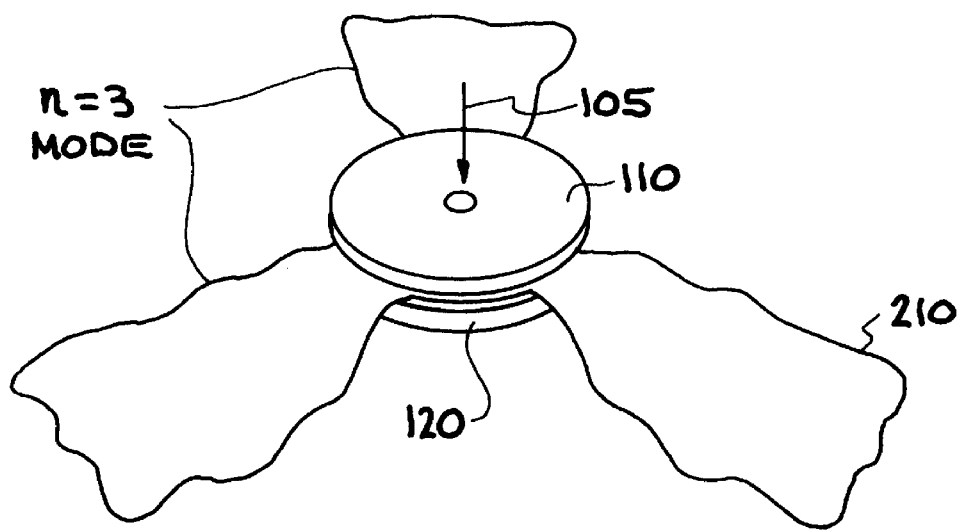
FIG. 2 depicts the naturally occurring azimuthal structures, known in the prior art, (mode number n=3) for a highly strained flame.

The highly strained flames produced in stagnation flow reactors such as that shown in FIG. 1, are prone to instability and tend to develop a non-axisymmetric flame front, wherein the outer diffusion portion of the flame 210 can display an angular asymmetry that is manifest in a series of azimuthal structures, or nodes, as shown in FIG. 2. These unstable structures are prone to extinction and flame extinction typically occurs within seconds of their onset. The inventors have observed that flame stability in stagnation flow reactors was found to decrease as the mode number, i.e., the number of branches of the flame, decreased and extinction always occurred with n=3 nodes. However, the inventors have found that by increasing the mode number (i.e., the number of flame nodes) the outer diffusion portion of the flame was forced to assume a more axisymmetric aspect, thereby making it possible to increase the stability of the flame during flame synthesis in a stagnation flow reactor. In the limit, when mode number n=∞, the highly strained flame is axisymmetric and operation of the stagnation flow reactor is most stable.

Figure 3:
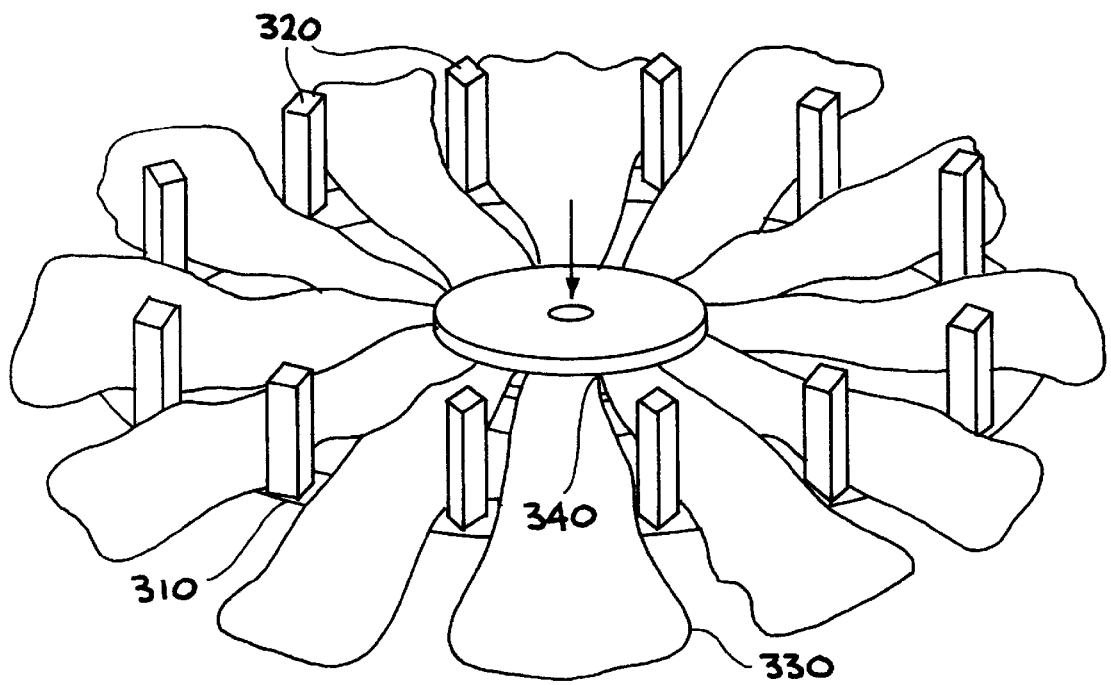
FIG. 3 shows one embodiment of the present invention dividing the flame into 12 equal segments.

Referring now to FIG. 3, one embodiment of a device for stabilizing highly strained flames is shown as an annular ring 310 that is positioned coaxially and coplanar with substrate 120. Spaced apart, vertical pillars 320 are mounted on the top surface of annular ring 310 and spaced equidistant from one another, thereby dividing the outer, diffusion protion of the flame 330 into n equal segments, where n is the number of spaced apart, vertical pillars. It has been found that n should be at least 6 and preferably 12. The annular ring and pillars can be made of any material capable of withstanding the conditions of flame synthesis, however, stainless steel or molybdenum are preferable.

By incorporating the stabilization device of the present invention into the substrate structure, the stabilized flame now comprises two principal parts; an inner substrate stabilized flame 340 and an outer axisymmetric diffusion flame 330.

In order for those skilled in the art to more readily make and use the present invention, the following example is given showing a method of application, namely, growing a uniform diamond film by flame synthesis.

EXAMPLE

Figure 4:
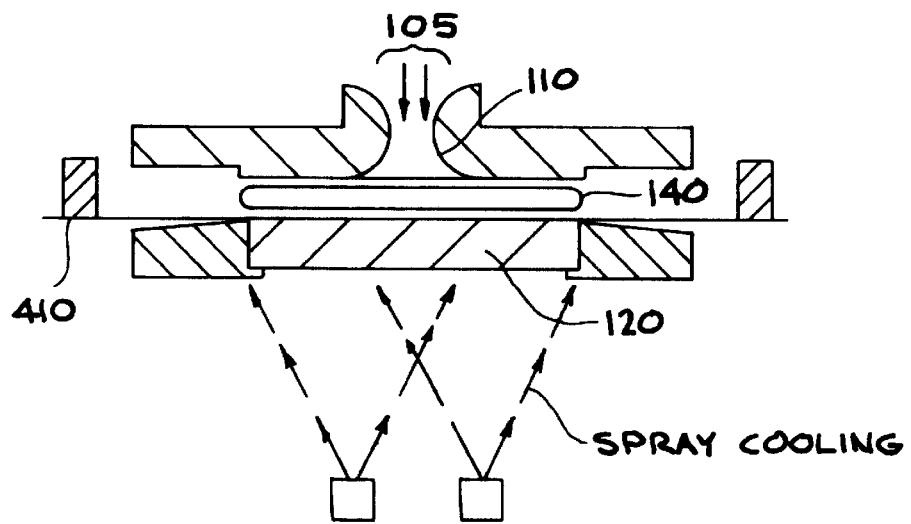
FIG. 4 shows a stagnation flow reactor incorporating a flame stabilizer.
Figure 5:
FIG. 5 is a micrograph of a diamond film prepared in the reactor of FIG. 4.

Diamond films were grown at atmospheric pressure using the highly strained flame stagnation flow reactor geometry shown in FIG. 4. A flame stabilizer 410 having 12 nodes (n=12) was used enabling the highly strained flame to completely cover a 5-cm diameter substrate 120. The substrate 120 surface temperature varied between 1000 and 1250 K. The total flow of premixed acetylene/oxygen/hydrogen gas 105 was fed through nozzle 110 at an inlet velocity of about 72 m/s. The gas mixture was ignited to form a flame 140. The separation between nozzle 110 and the molybdenum substrate 120 was about 2.5 mm; thereby forming a highly strained flame. The flame stoichiometry was varied over the ranges of $C_2H_2/O_2$=0.97 to 1.03 and $H_2/O_2$=0.57 to 0.66. Approximately 5% by volume of either $N_2$ or Ar were also added to the inlet gas mixture. Under these conditions, diamond film growth rates of up to 30 μm/hr were observed. A scanning electron micrograph of the resulting diamond film is shown in FIG. 5. It can be seen that the diamond film produced under these conditions exhibited well formed facets. Raman spectral analysis of these diamond films established the synthesis of diamond and the absence of $sp^2$-bonded carbon. Uniform diamond film morphology and thickness were observed over the majority of the surface area of the film. By using the flame stabilizer of the present invention a very uniform and stable highly strained flame could be maintained for periods of time up to 3 hrs in duration enabling high quality diamond films to be grown.

The foregoing example is illustrative of the invention and should not be construed as limiting. Various modifications may occur to those skilled in the art without departing from the scope of the invention as defined by the appended claims.

We claim:

1. A method of growing films by flame synthesis, comprising the steps of:
   a) positioning a flame stabilizer on a top surface of a substrate in a stagnation flow reactor, wherein the flame stabilizer comprises;
      i) an annular ring having a top surface, wherein said annular ring is positioned coaxially and coplanar with the substrate, and
      ii) spaced apart, vertical pillars mounted on the top surface of said annular ring, wherein said vertical pillars are spaced equidistant from one another thereby dividing a flame into equal segments;

b) injecting a gas through a nozzle in the stagnation flow reactor, wherein the nozzle is spaced apart from and parallel to the substrate and wherein the gas is suitable for forming a film;

c) igniting the gas to form a flame;

d) impinging the flame onto the substrate surface; and d) decreasing the separation distance between the nozzle and the top surface of the substrate to form a strained flame.

2. The method of claim 1, wherein the film is a diamond film.

3. The method of claim 2, wherein the gas is a mixture of acetylene, oxygen, hydrogen and a gas selected from the group consisting of nitrogen and argon.

4. The method of claim 2, wherein the ratio of acetylene:oxygen is less than about 1.1, the ratio of hydrogen:oxygen is between about 0.6 and 1.0, and the concentration of nitrogen or argon is between about 0 and 25% by volume.

5. The method of claim 1, wherein the number of the equal segments is at least 6.

6. The method of claim 1, wherein the number of the equal segments is 12.

7. The method of claim 1, wherein the separation distance is less than about 2.5 mm.

8. The method of claim 1, wherein the film growth rate is greater than about 25 $\mu$m/hr.

* * * * *